United States Patent
Tanaka

[11] Patent Number: 6,159,623
[45] Date of Patent: Dec. 12, 2000

[54] PALLADIUM PLATING SOLUTION, PALLADIUM PLATING FILM FORMED USING THE SOLUTION AND LEAD FRAME FOR SEMICONDUCTOR APPARATUSES HAVING THE PALLADIUM PLATING FILM

[75] Inventor: Hisahiro Tanaka, Fukuoka, Japan

[73] Assignee: Matsushita Electric Industrial Co., Ltd., Osaka, Japan

[21] Appl. No.: 09/082,550

[22] Filed: May 21, 1998

[30] Foreign Application Priority Data

May 30, 1997 [JP] Japan .................................. 9-141939
Nov. 12, 1997 [JP] Japan .................................. 9-310153

[51] Int. Cl.⁷ .................................................. B32B 15/01
[52] U.S. Cl. .......................................... 428/670; 205/265
[58] Field of Search ................................ 428/670, 671, 428/680; 205/265

[56] References Cited

U.S. PATENT DOCUMENTS

| | | | |
|---|---|---|---|
| 3,972,787 | 8/1976 | Nobet et al. | 204/47 |
| 4,463,060 | 7/1984 | Updegraff | 428/669 |
| 4,849,303 | 7/1989 | Graham et al. | 428/670 |

FOREIGN PATENT DOCUMENTS

| | | |
|---|---|---|
| 6349382 | 9/1984 | Japan . |
| 4115558 | 4/1992 | Japan . |
| 4287089 | 10/1992 | Japan . |
| 6232311 | 8/1994 | Japan . |

*Primary Examiner*—Kishor Mayekar
*Attorney, Agent, or Firm*—Stevens, Davis, Miller & Mosher, L.L.P.

[57] ABSTRACT

A palladium plating film having excellent soldering characteristics, including excellent solder wettability, high solder wetting speed, and especially the maintenance of these characteristics in a high-temperature atmosphere, is produced by using a palladium plating solution. The palladium plating film can be used, for example, for the plating of electrical and electronic parts. The palladium plating solution used contains a soluble palladium salt and a quaternary compound, and, if necessary, further contains a pyridine derivative or a salt thereof, and optionally further contains at least one compound selected from ammonium chloride, ammonium hydrogenphosphate, ammonium nitrate, ammonium sulfate, ammonium chloride and boric acid or a soluble selenium salt.

25 Claims, 4 Drawing Sheets

PALLADIUM PLATING SOLUTION, PALLADIUM PLATING FILM FORMED USING THE SOLUTION AND LEAD FRAME FOR SEMICONDUCTOR APPARATUSES HAVING THE PALLADIUM PLATING FILM

BACKGROUND OF THE INVENTION

The present invention relates to a plating solution for palladium plating, and especially to a palladium plating film as materials for electric and electronic parts required to have solder wettability and heat resistance, a palladium plating solution for obtaining the film, and a lead frame for semiconductor apparatuses having the palladium plating film formed using the plating solution.

Palladium plating solutions have been widely studied for a long time, and the plating films obtained therefrom have characteristics such as excellent corrosion resistance, wear resistance, and electric properties. Therefore, palladium plating has been used as a substitute for gold plating in uses relating to electrical and electronic parts such as electrical contacts, connectors, and circuit substrates, since it is more economical than gold plating.

Various palladium plating solutions have been developed, such as, for example, those comprising palladium chlorides and pyridine, sulfates, and nitrites. However, when these palladium plating solutions are used, internal stress in the plating films tends to increase, and, hence, either control of thickness is difficult, or no sufficient ductility can be obtained. Furthermore, with regard to the practical problems, e.g., insufficient bonding property and solder wettability after heat treatment which are important as plating for electronic parts, there are known palladium plating solutions which contain selenium, cerium, urea or fluorine-based surface active agent for solving the problem of internal stress or improving glossiness.

Moreover, there are known plating films having on the surface Pd or Pd-Ni alloy film (JP-B-63-49382), Pd-Bi alloy film (JP-A-4-287089), Pd-X (X=boron, phosphorus, arsenic, selenium, tellurium, antimony: JP-A-6-232311), or having an Au plating film on Pd or Pd alloy film (JP-A-4-115558).

However, these conventional techniques do not sufficiently solve the practical problems such as solder wettability, heat resistance and bonding property. Recently, the performance of various electronic apparatuses has been further enhanced and more severe demands have been made for semiconductor devices. Therefore, palladium plating materials used in these applications must have the properties of higher performance and stability, and thus demand for improvement of palladium plating solutions becomes stronger.

For example, palladium plating solutions are also utilized in the field of lead frames which are components for mounting chips of semiconductor devices, but there remain problems to be solved as stated below.

FIG. 4 is a plan view which shows a general example of a lead frame, and FIG. 5 is a sectional view of the lead frame shown in FIG. 4. In FIG. 4 and FIG. 5, inner lead part 2 is formed around chip-mounting part 1, and outer lead part 3 is provided through tie bar part 4. Semiconductor chip 5 is mounted on the chip-mounting part 1 and fixed by adhesive 6, and, furthermore, electrode 7 on the semiconductor chip 5 and the inner lead part 2 are bonded by wire 8 and besides sealed by sealing resin 9.

In the production of the lead frame shown, the following steps are conducted in succession: the whole of the Ni plated substrate is further subjected to palladium plating; semiconductor chip 5 is bonded to chip-mounting part 1; the terminal of semiconductor chip 5 and inner lead part 2 are bonded by wire 8; and furthermore the whole of the lead frame other than the outer lead part 3 is sealed with sealing resin 9.

The plan view of the lead frame shown in FIG. 4 illustrates only the lead frame before bonding of semiconductor chip 5, bonding of the chip and the inner lead frame part by wire 8 and sealing with sealing resin 9. After bonding of semiconductor chip 5, bonding by wire 8 and sealing with sealing resin 9, the frame lead is cut so as to attain such state that the corresponding inner lead part 2 and outer lead part 3 are electrically connected and adjacent inner lead parts 2 and adjacent outer lead parts 3 do not short-circuit. Thereafter, the outer lead part 3 is bonded to other electronic parts with solder, and used.

Palladium is a noble metal which is a chemically stable material like gold. There are, therefore no special problems in the bonding property of palladium plating film to semiconductor chip 5 and in wire bonding property. However, the palladium plating film undergoes an oxidation reaction by the heating to high temperatures at the time of bonding of semiconductor chip 5 to the palladium plating film, resulting in deterioration of solder wettability in the subsequent steps. This causes difficulty in soldering outer lead part 3 which is exposed outside after sealing with sealing resin 9. That is, the wetting rate lowers and it becomes difficult to cover the required solder wetting area. For this reason, the dipping time in the soldering tank increases and results in deterioration of operation efficiency, and, in an extreme case, the solder cannot be applied at all. Especially, with the recent increase in density of semiconductor devices, the distance between outer lead parts 3 becomes smaller, and,at the time of reflow bonding with a cream solder in surface assembling, the cream solder flows in transverse direction of substrate due to insufficient wettability of solder. Bridges formed between wirings can cause short short circuits. Formation of the bridge can be diminished to some extent by reducing the coating amount of the cream solder, while due to reduction of coating amount of cream solder, coating height of cream solder lowers and sometimes bonding becomes impossible owing to variation of distance between outer lead part 3 and substrate, resulting in an opening of the circuit.

The present invention solves the above problems in conventional techniques and aims at providing a palladium plating solution for obtaining a palladium plating film having excellent soldering characteristics such as good solder wettability and high solder wetting rate, which are not deteriorated in a high-temperature atmosphere, and furthermore providing such a plating film.

SUMMARY OF THE INVENTION

For the solution of the problems, the palladium plating solution of the present invention contains a soluble palladium salt and a quaternary compound. Furthermore, pyridine derivatives or salts thereof may be added to the above basic composition. Moreover, there may be further added at least one compound selected from ammonium chloride, ammonium hydrogenphosphate, ammonium nitrate, ammonium sulfate, ammonium bromide and boric acid, or a soluble selenium salt.

According to the above construction, there is provided a palladium plating film having excellent soldering performances such as good solder wettability and high solder wetting rate, which are not deteriorated in a high-temperature atmosphere, and there is further provided a palladium plating solution for obtaining the above plating film.

DETAILED DESCRIPTION OF THE INVENTION

Figure 1:
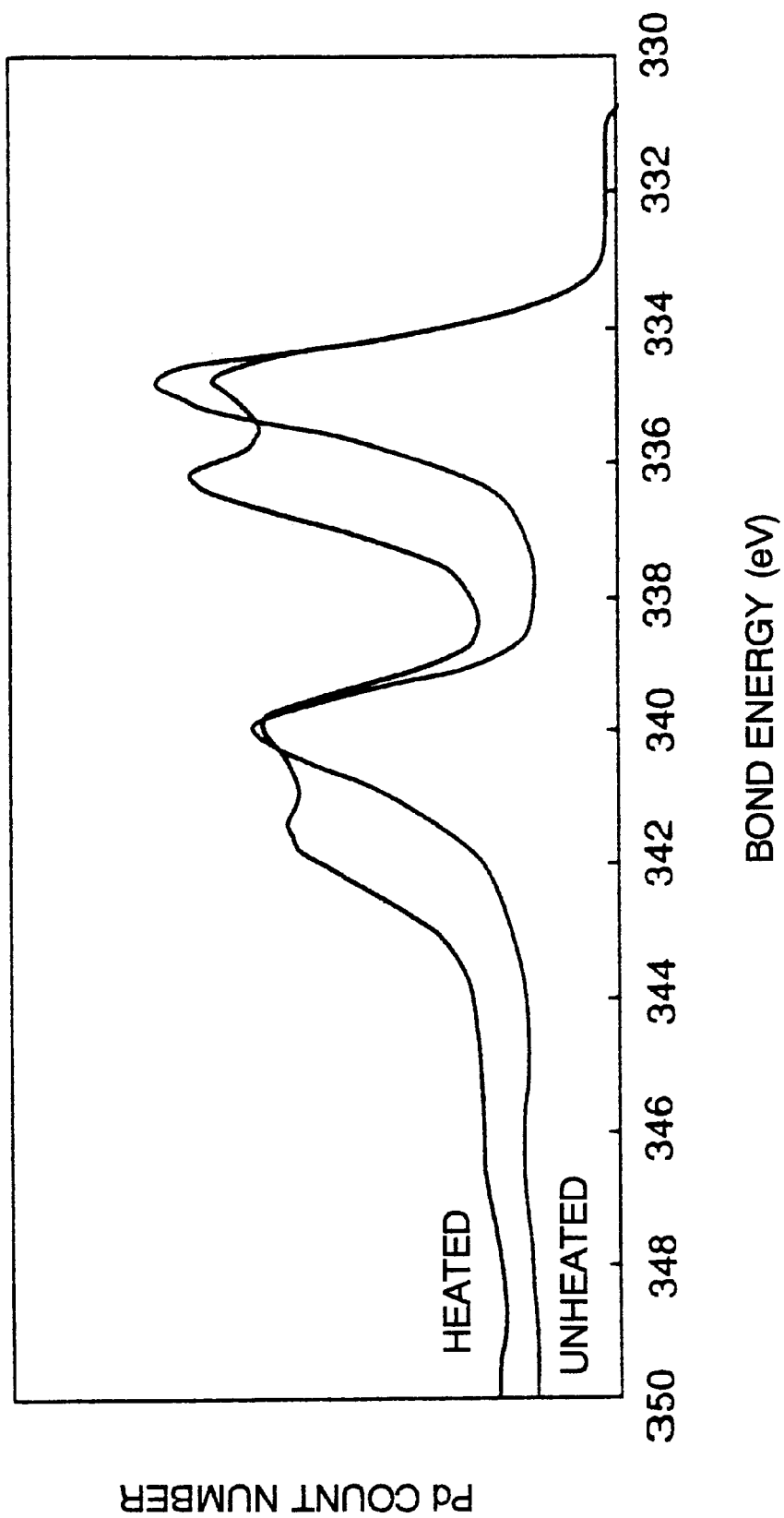
FIG. 1 is an XPS spectrum of metallic Pd and palladium oxide PdO before and after heating in the comparative example.

The first invention is a palladium plating solution, characterized by containing a soluble palladium salt and a quaternary compound. The quaternary compound is preferably represented by the formula $R_4ZX$ (wherein R is a monovalent organic group, Z is a monovalent cation and an element of Group V of the periodic table, and X is an anion, preferably a monovalent anion of an acid). A palladium plating film formed using the solution is improved in wettability with solder on the surface since the quaternary compound which is oxidized in a high-temperature atmosphere inhibits oxidation of palladium.

The second invention is the palladium plating solution of the first invention wherein the soluble palladium salt is at least one selected from halides of palladium, sulfates of palladium, nitrates of palladium, phosphates of palladium, sulfites of palladium, nitrites of palladium and ethylenediaminetetraacetates of palladium. That is, suitable soluble palladium salts are specified here.

The third invention is the palladium plating solution of the first invention which contains the soluble palladium salt in an amount of 0.1–50.0 g/l in terms of palladium. That is, a suitable amount of the soluble palladium salt is specified here.

The fourth invention is the palladium plating solution of the first invention which additionally contains a pyridine derivative or a salt thereof. The palladium plating film formed using this solution has a smooth surface, and, hence, the film is hardly oxidized in a high-temperature atmosphere. Additionally, the film is improved in wettability with solder on the surface and gloss is imparted to the film.

The fifth invention is the palladium plating solution of the fourth invention wherein the pyridine derivative is pyridinesulfonic acid or pyridinecarboxylic acid. That is, suitable pyridine derivative is specified here.

The sixth invention is the palladium plating solution of the fifth invention wherein the pyridinesulfonic acid is pyridine-3-sulfonic acid. That is, a suitable pyridienesulfonic acid is specified.

The seventh invention is the palladium plating solution of the fifth invention wherein the pyridinecarboxylic acid is at least one selected from picolinic acid, nicotinic acid, quinolinic acid, lutidinic acid and 2,6-dipicolinic acid. That is, suitable pyridinecarboxylic acids are specified here.

The eighth invention is the palladium plating solution of the fourth invention wherein the salt of pyridine derivative is at least one selected from ammonium salt, potassium salt and sodium salt of pyridine derivative. That is, suitable salts of pyridine derivative are specified here.

The ninth invention is the palladium plating solution of the fourth invention which contains the pyridine derivative or salt of the pyridine derivative in an amount of 0.1–20.0 g/l. That is, a suitable amount of the pyridine derivative and the salt of the pyridine derivative is specified here.

The tenth invention is the palladium plating solution of any one of the first to ninth inventions wherein the quaternary compound is a compound represented by the following formula (1):

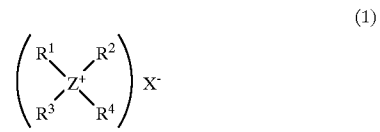

(wherein $R^1$, $R^2$, $R^3$, and $R^4$ each represent a substituted or unsubstituted alkyl group, a substituted or unsubstituted alkenyl group, a substituted or unsubstituted aryl group or a substituted or unsubstituted aralkyl group, $R^1$ and $R^2$, and $R^3$ and $R^4$ may form a ring with each other, Z represents a nitrogen atom, a phosphorus atom, an arsenic atom or an antimony atom, and $X^-$ represents an anion).

The eleventh invention is the palladium plating solution of the first invention wherein the quaternary compound is contained in an amount of 10–3000 ppm for metallic palladium in terms of concentration of z in the formula (1). That is, a suitable amount of the quaternary compound is specified here.

The twelfth invention is the palladium plating solution of the first invention which additionally contains at least one selected from ammonium chloride, ammonium hydrogenphosphate, ammonium nitrate, ammonium sulfate, ammonium bromide and boric acid. The addition of the above improves the buffering property of the plating solution and forms a uniform plating film, and enhances the conductivity. The buffering property here means stabilization of pH of the plating solution.

The thirteenth invention is the palladium plating solution of the first invention which additionally contains a soluble selenium salt. The addition of the above relaxes the internal stress of the plating film and gives gloss to the film. The additives referred to in the fourth invention, the twelfth invention and the thirteenth invention may be used each alone or in combination.

The fourteenth invention is the palladium plating solution of the thirteenth invention wherein the soluble selenium salt is at least one selected from selenious acid, alkali salt thereof and hydrocyanic acid complex salt thereof. That is, suitable soluble selenium salts are specified.

The fifteenth invention is the palladium plating salt of the thirteenth invention wherein the soluble selenium salt is contained in an amount of 0.0001–2.0 g/l in terms of selenium. That is, a suitable amount of the soluble selenium salt is specified here.

The sixteenth invention is a palladium plating film formed using the palladium plating solution of the first invention. This palladium plating film has fine crystal grain size and has a smooth surface, and can be inhibited from oxidation of palladium due to oxidation of the quaternary compound in a high-temperature atmosphere, resulting in improvement of wettability of solder on the surface of the plating film. The palladium plating solutions of the second invention to the fifteenth invention can be suitably used.

The seventeenth invention is a palladium plating film formed using the palladium solution of claim 1 wherein the PdO/Pd value based on photoelectron intensity according to X-ray photoelectronic spectroscopy of the surface of the film after heat treatment is 0.8 or less. The plating film has a small PdO value according to X-ray photoelectronic spectroscopy, inhibited from oxidation of palladium, and is improved in wettability of solder on the surface of the film.

The eighteenth invention is a palladium plating film formed using the palladium plating solution of claim 1 wherein 1% or more of the cation central element of the quaternary compound is observed by X-ray photoelectronic spectroscopy on the surface of the film, for example, in the range of 50–10 Å from the surface, after heat treatment. Since oxidation of palladium can be inhibited as a result of the concentrated presence of cation central elements of the quaternary compound on the surface, wettability of solder on the surface of the film is improved.

The nineteenth invention is a palladium plating film formed using the palladium plating solution of claim 1 wherein the cation central element of the quaternary compound observed by X-ray photoelectronic spectroscopy on the surface of the film after heat treatment is less than 1% by X-ray photoelectronic spectroscopy on the surface after being subjected to etching treatment, for example, etching treatment of 50–1000 Å from the surface.

The twentieth invention is a palladium plating film formed using the palladium plating solution of claim 1 wherein the cation component of the quaternary compound is converted to a carbonate after heat treatment according to time-of-flight type secondary ion-mass spectrography. Since the quaternary compound present on the surface is oxidized by the heat treatment and oxidation of palladium can be inhibited, wettability of solder on the surface of the film is improved.

The twenty-first invention is a lead frame for semiconductor apparatuses wherein a palladium plating film formed using the palladium plating solutions of the first invention is formed on at least the outer lead part. The formed plating film has an excellent solderability, and the bonding property of the inner lead and the outer lead is improved. The palladium plating solutions of the second invention to the fifteenth invention can be suitably used.

The twenty-second invention is a lead frame for semiconductor apparatuses wherein a palladium plating film of the seventeenth invention is formed on at least the outer lead part. The formed plating film has an excellent solderability, and the bonding property of the inner lead and the outer lead is improved.

The twenty-third invention is a lead frame for semiconductor apparatuses wherein a palladium plating film of the eighteenth invention is formed on at least the outer lead part. The formed plating film has an excellent solderability, and the bonding property of the inner lead and the outer lead is improved.

The twenty-fourth invention is a lead frame for semiconductor apparatuses wherein a palladium plating film of the nineteenth invention is formed on at least the outer lead part. The formed plating film has an excellent solderability, and the bonding property of the inner lead and the outer lead is improved.

The twenty-fifth invention is a lead frame for semiconductor apparatuses wherein a palladium plating film of the twentieth invention is formed on at least the outer lead part. The formed plating film has an excellent solderability, and the bonding property of the inner lead and the outer lead is improved.

As mentioned above, in the present invention, a quaternary compound is used together with a soluble palladium salt which is a basic material for palladium plating. The quaternary compound per se is oxidized and decomposed in a high-temperature atmosphere to inhibit oxidation of palladium, thereby improving wettability of the surface of the plating film. The pyridine derivatives and salts thereof make the crystal grain finer to smoothen the plating film surface. Ammonium chloride, ammonium hydrogenphosphate, ammonium nitrate, ammonium sulfate, ammonium bromide and boric acid serve to improve the buffering property of the plating solution, resulting in a uniform plating film and further to enhance conductivity. Furthermore, gloss can be given to the film by relaxing internal stress in the plating film with the soluble selenium salt.

The mode for carrying out the present invention will be explained.

The soluble palladium salts usable in the present invention are not especially limited, and are preferably at least one selected from halides of palladium, nitrates of palladium, phosphates of palladium, sulfites of palladium, nitrites of palladium and ethylenediaminetetraacetates of palladium. As examples, mention may be made of dichloroamminepalladium, dichlorotetramminepalladium, dibromoamminepalladium, dibromotetramminepalladium, dinitrodiamminepalladium, and dinitrotetramminepalladium. The plating solution contains the palladium salt at a concentration of usually 0.1–50.0 g/l, preferably 5.0–30.0 g/l in terms of palladium metal concentration. If the concentration is too low, the plating rate becomes impractically low when the plating rate is increased by increasing current density, scorching occurs and sometimes normal film cannot be obtained. If the concentration is too high, much palladium metal is consumed due to dipping out of the solution, and this is not economical. These salts may be used each alone or in combination of two or more.

The quaternary compounds are those which are more easily oxidized than palladium under high temperature treatment and are preferably represented by the following formula.

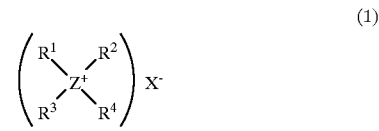

(1)

In the above formula, $R^1$, $R^2$, $R^3$, and $R^4$ each represent an alkyl group (e.g., methyl group, ethyl group, propyl group, butyl group, or the like), an alkenyl group (e.g., vinyl group, propenyl group, allyl group, or the like), an aryl group (e.g., phenyl group, naphthyl group, or the like), or an aralkyl group (e.g., benzyl group, phenethyl group, or the like). These groups may be substituted. The substituents are not particularly limited, and as examples of the substituents, mention may be made of halogen atoms (e.g., chlorine, bromine, and the like), hydroxyl group, alkyl groups (e.g., methyl group, ethyl group, propyl group, butyl group, and the like), nitro group, and the like. The number of carbon atoms of $R^1$, $R^2$, $R^3$ and $R^4$ is also not limited, but is preferably 1–30, more preferably 1–20. $R^1$ and $R^2$, and $R^3$ and $R^4$ may respectively form a ring with each other. Z, a cation central element, represents a nitrogen atom, a phosphorus atom, an arsenic atom or an antimony atom, and $X^-$ represents an anion. Examples of the anion represented by $X^-$ are chloride ion, bromide ion, iodide ion, nitrite ion, hypochlorite ion, benzenesulfonate ion, hydroxide ion, and the like.

As examples of representative examples of the compounds represented by the formula (1), mention may be made of the following compounds (2)–(17), but the compounds used in the present invention is not limited to these exemplified compounds.
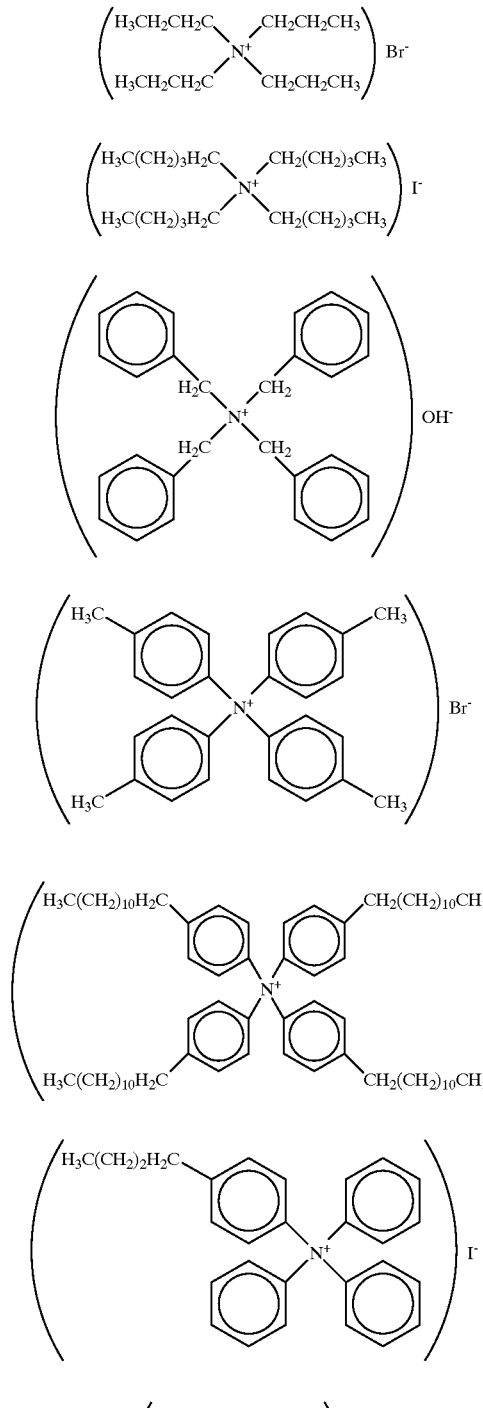
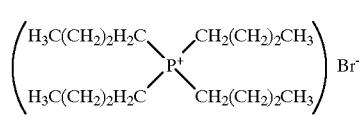
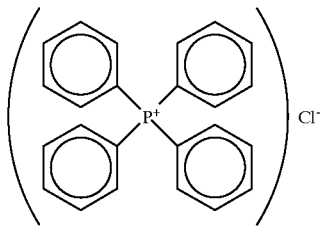
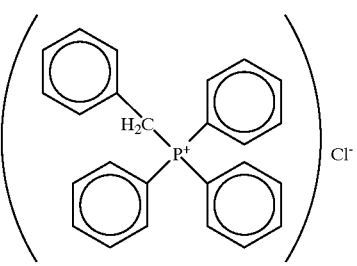
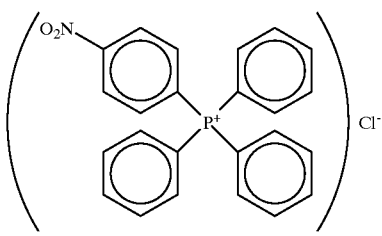
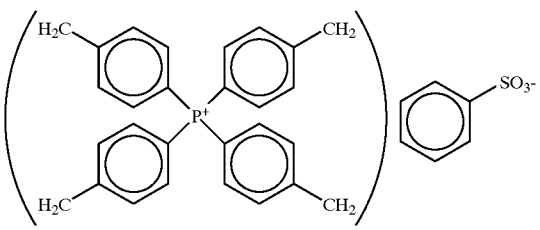
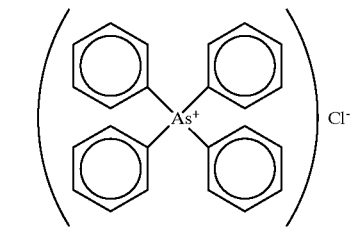
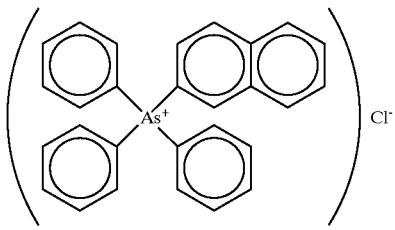

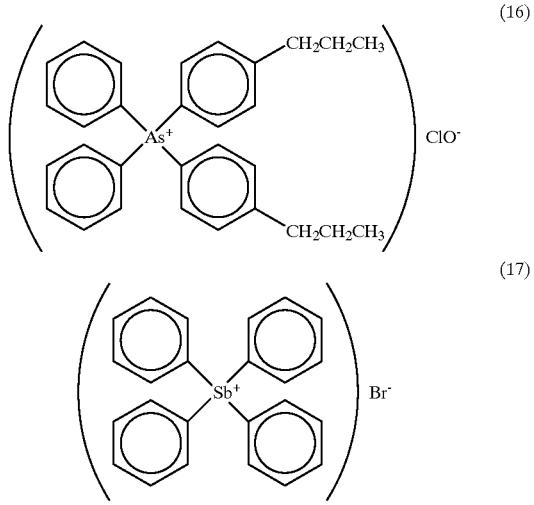

Concentration of the compound represented by the formula (1) in the plating solution in terms of Z concentration is usually 10–3000 ppm, preferably 50–1000 ppm per metallic palladium. If the concentration of the compound represented by the formula (1) is too low, no effect is exhibited, and if it is too high, the surface state of the plating film is deteriorated. The compounds represented by the formula (1) may be used each alone or in combination of two or more.

The pyridinesulfonic acid or salts thereof include, for example, pyridine-3-sulfonic acid, ammonium pyridine-3-sulfonate, potassium pyridine-3-sulfonate, and the like. The pyridinecarboxylic acid or salts thereof include, for example, picolinic acid, nicotinic acid, quinolinic acid, lutidinic acid, 2,6-dipicolinic acid, and ammonium salts, potassium salts, and sodium salts of these acids. Concentration of the pyridinesulfonic acid or salts thereof and the pyridinecarboxylic acid or salts thereof in the plating solution is usually 0.1–20.0 g/l, preferably 1.0–10.0 g/l. If the concentration of the pyridinesulfonic acid or salts thereof and the pyridinecarboxylic acid or salts thereof is too low or too high, the surface state of the plating film is deteriorated and this is not practical. The pyridine compounds may be used each alone or in combination of two or more.

Examples of the soluble selenium salt are selenious acid, alkali salts and hydrocyanic acid complex salts thereof, and the like. Concentration of the soluble selenium salt is usually 0.0001–2.0 g/l, preferably 0.0005–0.01 g/l in terms of selenium. If the concentration is too low, the effect is small, and if it is too high, the surface state of the plating film is deteriorated and this is not practical. The soluble selenium salts may be used each alone or in combination of two or more.

Furthermore, ammonium chloride, ammonium hydrogenphosphate, ammonium nitrate, ammonium sulfate, boric acid or the like may be added to the plating solution in order to impart conductivity and buffering property to the plating solution. These compounds may be used each alone or in combination of two or more.

The temperature of the plating solution is usually 30–70° C., preferably 45–55° C. The pH of the plating solution is adjusted to usually 6–12, preferably 7–9 with aqueous ammonia, and the like. The cathode current density is usually 1–15 A/dm$^2$, preferably 5–10 A/dm$^2$.

Figure 4:
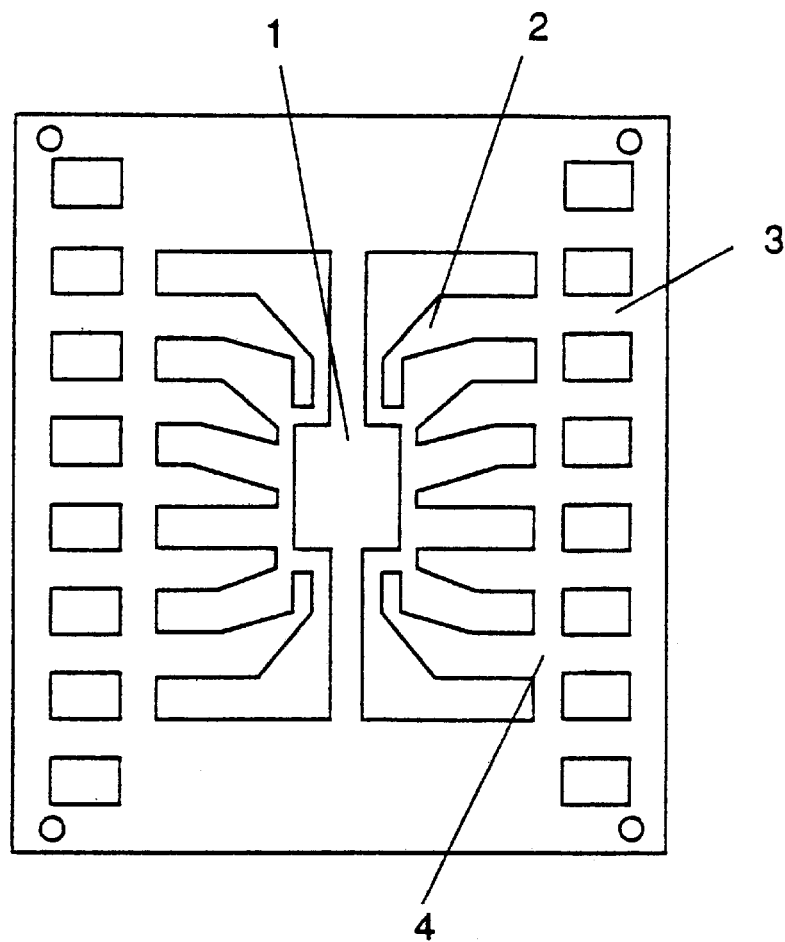
FIG. 4 is a plan view showing a general example of a lead frame.
Figure 5:
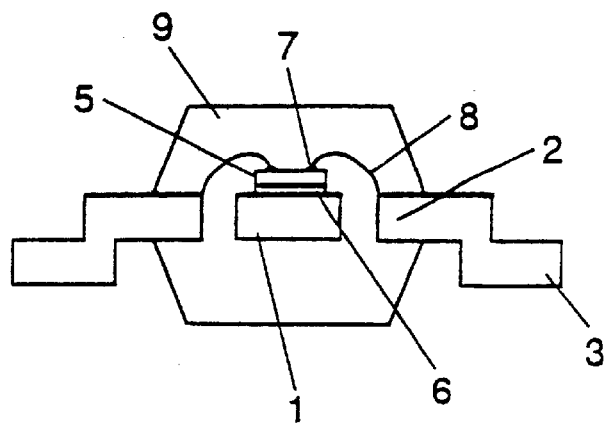
FIG. 5 is a sectional view of the lead frame of FIG. 4.

Examples of the present invention will be explained below. In the present invention, the shape of lead frame and construction in connection with other members are not limited, and, in the examples, one which is shown in FIG. 4 and FIG. 5 was used.

EXAMPLE 1

The following compounds were successively charged in a vessel and mixed, and pure water was added thereto to make up a given amount in total. The resulting plating solution was heated to 50° C. with stirring and pH was adjusted to 7.5–8.0 with aqueous ammonia. A lead frame made of copper and previously plated with nickel primary coat of 2.0 μm was subjected to palladium plating using a platinum-titanium (Pt/Ti) electrode as an anode for a plating time of 3 seconds at a cathode current density of 6 A/dm$^2$. Thus, a palladium plating film of 0.1 μm was obtained. The resulting plating film had no problem in gold wire bonding and showed no change in color in heat resistance test at 400° C. for 2 minutes. Furthermore, the plating film was heated at 345° C. for 30 seconds in the air, and then only the outer lead part of the lead frame was cut and mounted on a test apparatus, and subjected to a soldering test by equilibrium method specified in JIS C0053, thereby measuring a zero cross time (which is the interval time from when the action force first crosses the zero value by contacting the sample with the surface of the solder to when the action force crosses again the zero value due to the wetting of the sample after its receiving the buoyancy which acts on the sample). Thus, a good solder wettability of 2 seconds or less was obtained.

Composition of Plating Solution 1

| | |
|---|---|
| Dichlorodiamminepalladium | 10 g/l (in terms of metallic Pd) |
| Ammonium chloride | 80 g/l |
| Diammonium hydrogenphosphate | 80 g/l |
| Boric acid | 10 g/l |
| Compound (10) | 300 ppm (in terms of concentration of Z based on metallic Pd) |

EXAMPLE 2

Procedure of Example 1 was repeated, except that composition of the plating solution was as shown below. The resulting plating film had no problem in gold wire bonding and showed no change in color in the heat resistance test. Furthermore, the zero cross time was measured in the same manner as in Example 1 to obtain a good solder wettability of 2 seconds or less.

Composition of Plating Solution 2

| | |
|---|---|
| Dibromodiamminepalladium | 10 g/l (in terms of metallic Pd) |
| Ammonium bromide | 80 g/l |
| Diammonium hydrogenphosphate | 80 g/l |
| Pyridine-3-sulfonic acid | 2 g/l |
| Compound (2) | 2000 ppm (in terms of concentration of Z based on metallic Pd) |

EXAMPLE 3

Procedure of Example 1 was repeated, except that composition of the plating solution was as shown below. The resulting plating film had no problem in gold wire bonding and showed no change in color in the heat resistance test. Furthermore, the zero cross time was measured in the same manner as in Example 1 to obtain a good solder wettability of 2 seconds or less.

Composition of Plating Solution 3

| | |
|---|---|
| Dichlorodiamminepalladium | 10 g/l (in terms of metallic Pd) |
| Ammonium chloride | 80 g/l |
| Diammonium hydrogenphosphate | 80 g/l |
| Pyridine-3-sulfonic acid | 10 g/l |
| Compound (8) | 2000 ppm (in terms of concentration of Z based on metallic Pd) |

EXAMPLE 4

Procedure of Example 1 was repeated, except that composition of the plating solution was as shown below. The resulting plating film had no problem in gold wire bonding and showed no change in color in the heat resistance test. Furthermore, the zero cross time was measured in the same manner as in Example 1 to obtain a good solder wettability of 2 seconds or less.
Composition of Plating Solution 4

| | |
|---|---|
| Dibromodiamminepalladium | 10 g/l (in terms of metallic Pd) |
| Ammonium bromide | 60 g/l |
| Diammonium hydrogenphosphate | 60 g/l |
| Pyridine-3-sulfonic acid | 2 g/l |
| Compound (9) | 500 ppm (in terms of concentration of Z based on metallic Pd) |

EXAMPLE 5

Procedure of Example 1 was repeated, except that composition of the plating solution was as shown below. The resulting plating film had no problem in gold wire bonding and showed no change in color in the heat resistance test. Furthermore, the zero cross time was measured in the same manner as in Example 1 to obtain a good solder wettability of 2 seconds or less.
Composition of Plating Solution 5

| | |
|---|---|
| Dichlorodiamminepalladium | 10 g/l (in terms of metallic Pd) |
| Ammonium chloride | 80 g/l |
| Diammonium hydrogenphosphate | 80 g/l |
| Pyridine-3-sulfonic acid | 2 g/l |
| Compound (10) | 400 ppm (in terms of concentration of Z based on metallic Pd) |

EXAMPLE 6

Procedure of Example 1 was repeated, except that composition of the plating solution was as shown below. The resulting plating film had no problem in gold wire bonding and showed no change in color in the heat resistance test. Furthermore, the zero cross time was measured in the same manner as in Example 1 to obtain a good solder wettability of 2 seconds or less.
Composition of Plating Solution 6

| | |
|---|---|
| Dichlorodiamminepalladium | 10 g/l (in terms of metallic Pd) |
| Ammonium chloride | 80 g/l |
| Diammonium hydrogenphosphate | 80 g/l |
| Pyridine-3-sulfonic acid | 2 g/l |
| Compound (11) | 400 ppm (in terms of concentration of Z based on metallic Pd) |

EXAMPLE 7

Procedure of Example 1 was repeated, except that composition of the plating solution was as shown below. The resulting plating film had no problem in gold wire bonding and showed no change in color in the heat resistance test. Furthermore, the zero cross time was measured in the same manner as in Example 1 to obtain a good solder wettability of 2 seconds or less.
Composition of Plating Solution 7

| | |
|---|---|
| Dichlorodiamminepalladium | 10 g/l (in terms of metallic Pd) |
| Ammonium chloride | 80 g/l |
| Diammonium hydrogenphosphate | 80 g/l |
| Pyridine-3-sulfonic acid | 2 g/l |
| Compound (14) | 800 ppm (in terms of concentration of Z based on metallic Pd) |

EXAMPLE 8

Procedure of Example 1 was repeated, except that composition of the plating solution was as shown below. The resulting plating film had no problem in gold wire bonding and showed no change in color in the heat resistance test. Furthermore, the zero cross time was measured in the same manner as in Example 1 to obtain a good solder wettability of 2 seconds or less.
Composition of Plating Solution 8

| | |
|---|---|
| Dibromodiamminepalladium | 10 g/l (in terms of metallic Pd) |
| Ammonium bromide | 60 g/l |
| Diammonium hydrogenphosphate | 60 g/l |
| Pyridine-3-sulfonic acid | 2 g/l |
| Compound (17) | 600 ppm (in terms of concentration of Z based on metallic Pd) |

EXAMPLE 9

Procedure of Example 1 was repeated, except that composition of the plating solution was as shown below. The resulting plating film had no problem in gold wire bonding and showed no change in color in the heat resistance test. Furthermore, the zero cross time was measured in the same manner as in Example 1 to obtain a good solder wettability of 2 seconds or less.
Composition of Plating Solution 9

| | |
|---|---|
| Dichlorodiamminepalladium | 10 g/l (in terms of metallic Pd) |
| Ammonium chloride | 80 g/l |
| Diammonium hydrogenphosphate | 80 g/l |
| Pyridine-3-sulfonic acid | 2 g/l |
| Selenious acid | 10 ppm |
| Compound (10) | 400 ppm (in terms of concentration of Z based on metallic Pd) |

EXAMPLE 10

Procedure of Example 1 was repeated, except that composition of the plating solution was as shown below. The resulting plating film had no problem in gold wire bonding and showed no change in color in the heat resistance test. Furthermore, the zero cross time was measured in the same manner as in Example 1 to obtain a good solder wettability of 2 seconds or less.

Composition of Plating Solution 10

| | |
|---|---|
| Dichlorodiamminepalladium | 10 g/l (in terms of metallic Pd) |
| Ammonium chloride | 80 g/l |
| Diammonium hydrogenphosphate | 80 g/l |
| Pyridine-3-sulfonic acid | 2 g/l |
| Selenious acid | 10 ppm |
| Compound (14) | 800 ppm (in terms of concentration of Z based on metallic Pd) |

EXAMPLE 11

Procedure of Example 1 was repeated, except that composition of the plating solution was as shown below. The resulting plating film had no problem in gold wire bonding and showed no change in color in the heat resistance test. Furthermore, the zero cross time was measured in the same manner as in Example 1 to obtain a good solder wettability of 2 seconds or less.

Composition of Plating Solution 11

| | |
|---|---|
| Dichlorodiamminepalladium | 10 g/l (in terms of metallic Pd) |
| Ammonium chloride | 80 g/l |
| Diammonium hydrogenphosphate | 80 g/l |
| Boric acid | 10 g/l |
| Pyridine-3-sulfonic acid | 2 g/l |
| Compound (10) | 400 ppm (in terms of concentration of Z based on metallic Pd) |

Comparative Example 1

Procedure of Example 1 was repeated using the following plating solution which was the same as used in Example 11, except that it did not contain compound (10). The resulting plating film had no problem in gold wire bonding, but changed in its color in the heat resistance test conducted at 400° C. for 2 minutes. Furthermore, the zero cross time was measured in the same manner as in Example 1 to obtain an unsatisfactory solder wettability of 10 seconds or more. The results are shown in Table 1.

Composition of Plating Solution (Comparative Example 1)

| | |
|---|---|
| Dichlorodiamminepalladium | 10 g/l (in terms of metallic Pd) |
| Ammonium chloride | 80 g/l |
| Diammonium hydrogenphosphate | 80 g/l |
| Boric acid | 10 g/l |
| Pyridine-3-sulfonic acid | 2 g/l |
| Selenious acid | 10 ppm |

EXAMPLE 12

A plating film was produced in the same manner as in Example 1, except for using the plating solution of Example 11. The surface of the resulting plating film was subjected to X-ray photoelectronic spectroscopy (hereinafter referred to as "XPS") on metallic palladium, palladium oxide and phosphorus atom (analytical instrument: ESCA 5400MC manufactured by ULVAC-PHI. INC.). This plating film was heated at 345° C. for 30 seconds and then similarly subjected to XPS. The measuring conditions were as follows. Anode: MgKα, output: 15 kV 300 W, and resolving power: 0.97 eV (for Ag3d5/2).

Comparative Example 2

A plating film was produced in the same manner as in Example 1 using the above plating solution of comparative example 1. The surface of the resulting plating film was subjected to XPS in the same manner as in Example 12 on metallic palladium and palladium oxide.

Figure 2:
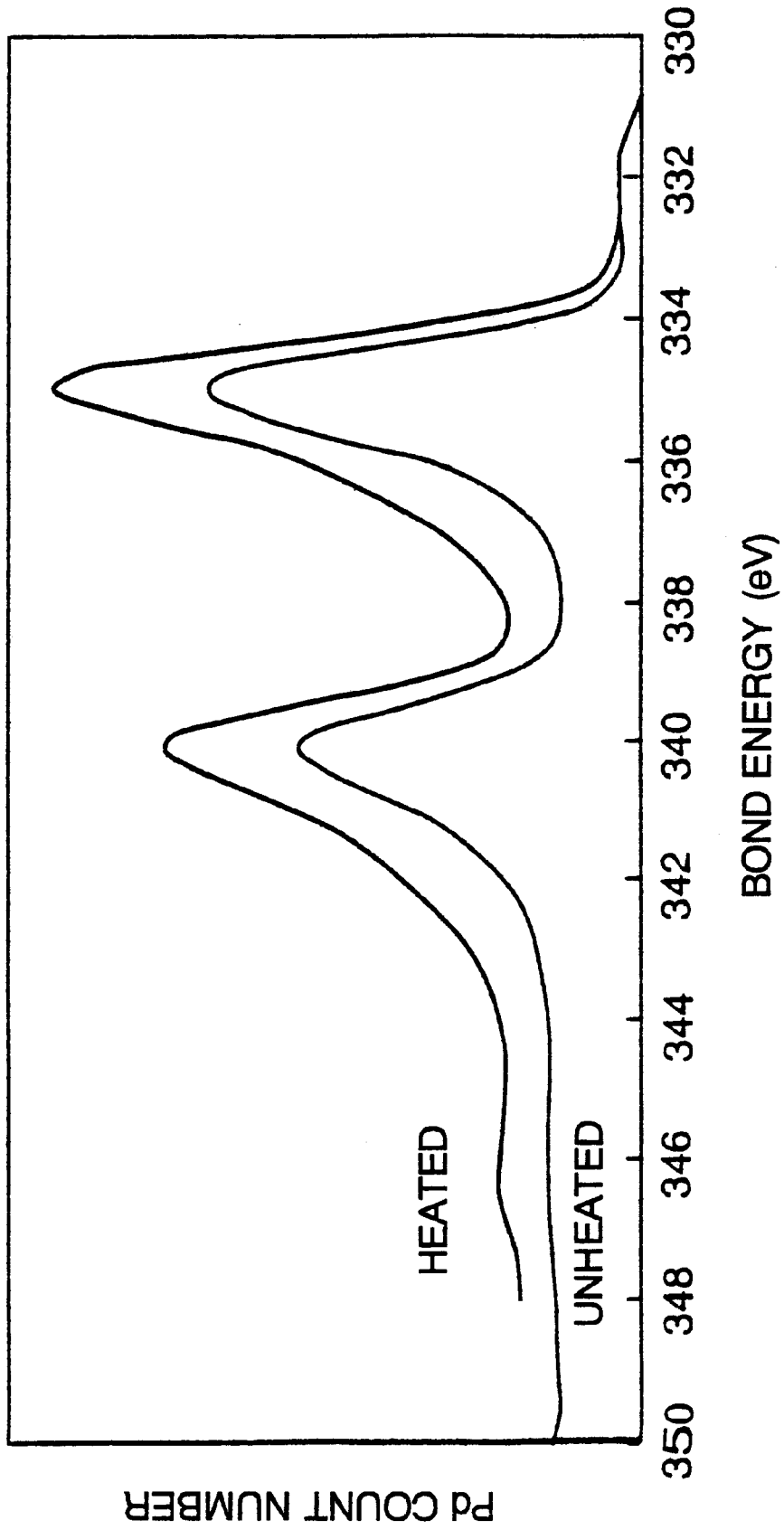
FIG. 2 is an XPS spectrum of metallic Pd and palladium oxide PdO before and after heating in Example 12.

FIG. 1 shows XPS spectra of metallic palladium Pd and palladium oxide PdO before and after heating in the comparative example 2, and FIG. 2 shows XPS spectra of metallic palladium Pd and palladium oxide PdO before and after heating in Example 12. As shown in FIG. 1, as for the conventional palladium plating film in the comparative example 2, the peak of PdO component which was hardly observed before heating became great after heating, and thus it can be seen that the palladium film was oxidized. On the other hand, as shown in FIG. 2, as for the palladium plating film of Example 12 of the present invention, the peak of PdO component did not become great even after heating, and it can be seen that the palladium plating film maintained oxidation resistance. In FIG. 1 and FIG. 2, the spectrum at 334.6 eV is a peak based on the bond energy of metallic palladium (bound energy of inner-shell electron in atom), and the spectrum at 336.2 eV is a peak based on the bond energy of palladium oxide. The Pd count number and PdO count number are shown in Table 1 as photoelectron intensity per 1 second (cps: counts per second).

TABLE 1

| | | Pd count number | PdO count number | PdO/Pd | Zero cross time (sec) |
|---|---|---|---|---|---|
| Example 12 | Before heating | 41.5 k | 20.6 k | 0.50 | 0.50 |
| | After heating | 53.4 k | 30.6 k | 0.57 | 0.73 |
| Comparative Example 1 | Before heating | 39.8 k | 19.2 k | 0.48 | 0.50 |
| | After heating | 36.0 k | 37.4 k | 1.03 | 10 - |

Next, the spectra of FIG. 1 and FIG. 2 were subjected to waveform separation by waveform separation software attached to the apparatus, and oxidation resistance of the palladium films was evaluated by spectrum intensity of metallic palladium and palladium oxide. The results are shown in Table 2. As shown in Table 2, it can be seen that the palladium plating film of the Example 12 hardly undergoes oxidation with heating as compared with the palladium film of the Comparative Example 2 as in Table 1.

TABLE 2

| | | Proportion of Pd (%) | Proportion of PdO (%) | PdO/Pd |
|---|---|---|---|---|
| Example 12 | Before heating | 93 | 7 | 0.08 |
| | After heating | 85 | 15 | 0.18 |
| Comparative Example 2 | Before heating | 96 | 4 | 0.04 |

TABLE 2-continued

|  | Proportion of Pd (%) | Proportion of PdO (%) | PdO/Pd |
|---|---|---|---|
| After heating | 57 | 43 | 0.75 |

Figure 3:
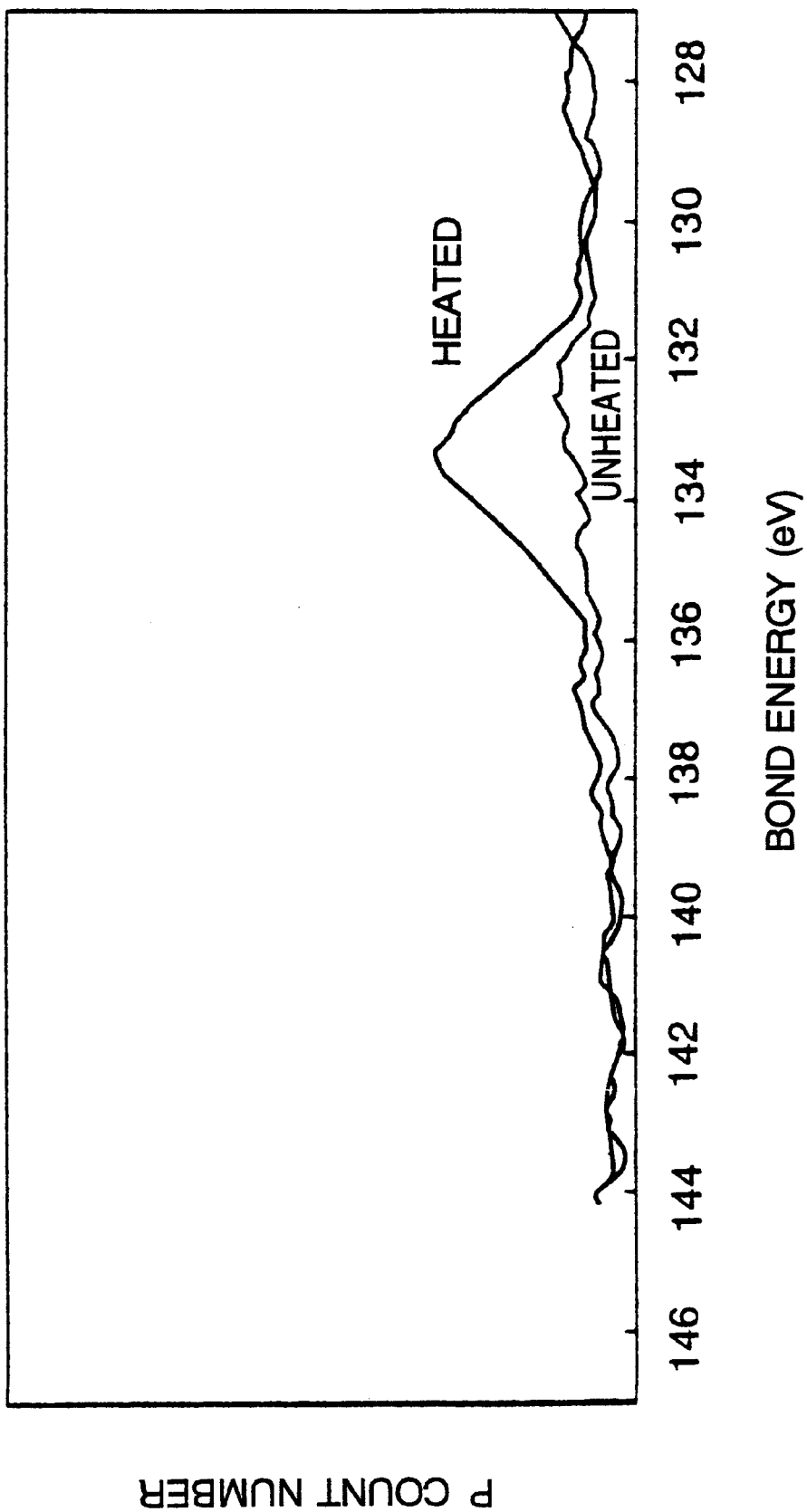
FIG. 3 is an XPS spectrum of phosphorus atom P before and after heating in Example 12.

FIG. 3 shows XPS spectra of phosphorus atom P before and after heating of the films in Example 12. The peak at 133.1 eV (2p3/2) is a peak based on the bond energy of P. The phosphorus atom which is a cation central element of compound (10) was not observed before heating because of less than 1% of detection limit of the analytical instrument, however while count number of P after heating at 345° C. for 30 seconds was about 4300. Then, when about 50–100Å of the surface of the palladium plating film was removed by sputter etching, the phosphorus atoms were not observed because of less than 1% of detection limit of the analytical instrument. It is considered that this is because the phosphorus atoms had migrated to the surface of the film by heating and were concentrated therein. That is, it is considered that when the plating film is heated, phosphorus atoms P of the quaternary compound present near the surface of the plating film are segregated and oxidized to inhibit oxidation of metallic palladium Pd.

EXAMPLE 13

A plating film was produced in the same manner as in Example 1 using the plating solution of Example 11. The resulting plating film was subjected to time-of-flight type secondary ion-mass spectrography (hereinafter referred to as "TOF-SIMS"). Furthermore, this plating film was heated at 345° C. for 30 seconds and then similarly subjected to TOF-SIMS. TOF-SIMS is a method according to which the surface of a sample is irradiated with an ion beam to emit the atoms on the surface of the sample by sputtering, and the ionized particles are subjected to time-of-flight (TOF) type mass spectrometer to measure the kind or concentration of elements contained in the extreme surface of the sample at high sensitivity. In TOF-SIMS, the count number corresponding to the number of ionized secondary ions shows the amount of the existing atoms and molecules corresponding to the mass number. The measuring conditions are as follows. Primary ion species: Ga$^+$; secondary ion species: cation/anion; primary ion energy (keV): 12/18; quantity of primary ion current (pA): 600 or less; raster area: 60 μm×60μm; analyzing region: 60.

Comparative Example 3

A plating film was produced in the same manner as in Example 1 using the same plating solution as in Example 11, except that it did not contain compound (10). The resulting plating film was subjected to TOF-SIMS in the same manner as in Example 13.

Table 3 shows existing amounts of tetraphenylphosphonium $(C_6H_5)_4P$ of mass number 339 which was a cation component of compound (10) and CPO produced upon decomposition of tetraphenylphosphonium by heating in Example 13 and Comparative Example. As shown in Table 3, the count number of tetraphenylphosphonium on the surface of the palladium plating film before heating in Example 13 was more than 1000 times the count number on the surface of the palladium plating film of the Comparative Example which was a blank film, and tetraphenylphosphonium was present. After heating, the count number of CPO of mass number of 59 which was a carbonate decomposition product of tetraphenylphosphonium was about twice the count number of Comparative Example 3, and CPO was present. That is, it is considered that the phosphorus compound which was present as tetraphenylphosphonium on the surface of the palladium plating film of Example 13 before heating was decomposed and converted to carbonate CPO after heating, thereby inhibiting oxidation of palladium. The results are shown in Table 3.

TABLE 3

|  |  | $(C_6H_5)_4P$ Count number | CPO Count number |
|---|---|---|---|
| Example 13 | Before heating | 72115 | 219 |
|  | After heating | 87 | 448 |
| Comparative Example 3 | Before heating | 71 | 217 |
|  | After heating | 29 | 219 |

The above Examples show only the palladium plating of lead frames, but the present invention can also exhibit its effects on plating of connectors, substrate terminals and other structures.

According to the present invention, palladium plating films having excellent soldering characteristics, namely, excellent solder wettability, high solder wetting speed, and especially no deterioration of these characteristics in high-temperature atmosphere can be obtained by using plating solutions containing a soluble palladium salt and a quaternary compound. The plating solutions can, if necessary, further contain a pyridine derivative or a salt thereof, and optionally further contain at least one compound selected from ammonium chloride, ammonium hydrogenphosphate, ammonium nitrate, ammonium sulfate, ammonium chloride and boric acid or a soluble selenium salt. A further advantageous effect of the present invention is that lead frames having optimized plating can be obtained.

What is claimed is:

1. A palladium plating film formed using a palladium plating solution, said solution comprising a soluble palladium salt and a quaternary compound, wherein the quaternary compound is a compound represented by the following formula (1):

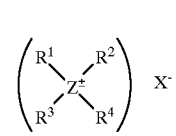

(1)

wherein $R^1$, $R^2$, $R^3$ and $R^4$ each represent a substituted or unsubstituted alkyl group, a substituted or unsubstituted alkenyl group, a substituted or unsubstituted aryl group, or a substituted or unsubstituted aralkyl group; said $R^1$ and $R^2$, and $R^3$ and $R^4$, respectively, are separate from one another or together form a ring; Z represents a nitrogen atom, a phosphorus atom, an arsenic atom or an antimony atom; and $X^-$ represents an anion,
wherein said film comprises said quaternary compound.

2. A palladium plating film according to claim 1, wherein Z represents a phosphorus atom, an arsenic atom or an antimony atom.

3. A palladium plating film according to claim 1, wherein said $R^1$ and $R^2$, and $R^3$ and $R^4$, respectively, are separate from one another.

4. A palladium plating film according to claim 1, wherein the soluble palladium salt is at least one compound selected from halides of palladium, sulfates of palladium, nitrates of palladium, phosphates of palladium, sulfites of palladium, nitrites of palladium, and ethylenediaminetetraacetates of palladium.

5. A palladium plating film according to claim 1 wherein the soluble palladium salt is present in an amount of 0.1–50.0 g/l in terms of palladium.

6. A palladium plating film according to claim 1 which further comprises a pyridine derivative or a salt thereof.

7. A palladium plating film according to claim 6 wherein the pyridine derivative is pyridinesulfonic acid or pyridinecarboxylic acid.

8. A palladium plating film according to claim 7 wherein the pyridinesulfonic acid is pyridine-3-sulfonic acid.

9. A palladium plating film according to claim 7 wherein the pyridinecarboxylic acid is at least one compound selected from picolinic acid, nicotinic acid, quinolinic acid, lutidinic acid and 2,6-dipicolinic acid.

10. A palladium plating film according to claim 6 wherein the salt of pyridine derivative is at least one compound selected from ammonium salt, potassium salt and sodium salt of the pyridine derivative.

11. A palladium plating film according to claim 6 wherein the pyridine derivative or salt thereof is present in an amount of 0.1–20.0 g/l.

12. A palladium plating film according to claim 1 wherein the quaternary compound is present in an amount of 10–3000 ppm based on metallic palladium in terms of concentration of Z in the formula (1).

13. A palladium plating film according to claim 1 which further comprises at least one compound selected from ammonium chloride, ammonium hydrogenphosphate, ammonium nitrate, ammonium sulfate, ammonium bromide and boric acid.

14. A palladium plating film according to claim 1 which further comprises a soluble selenium salt.

15. A palladium plating film according to claim 14 wherein the soluble selenium salt is at least one compound selected from selenious acid, alkali salt thereof and hydrocyanic acid complex salt thereof.

16. A palladium plating film according to claim 14 wherein the soluble selenium salt is present in an amount of 0.0001–2.0 g/l in terms of selenium.

17. A palladium plating film according to claim 1 wherein the film has a PdO/Pd value of 0.8 or less based on photoelectron intensity according to X-ray photoelectronic spectroscopy of the surface of the film after heat treatment.

18. A lead frame for semiconductor apparatuses wherein a palladium plating film of claim 17 is formed on at least an outer lead part.

19. A palladium plating film according to claim 1 wherein 1% or more of cation central element of the quaternary compound is observed by X-ray photoelectronic spectroscopy on the surface of the film after heat treatment.

20. A lead frame for semiconductor apparatuses wherein a palladium plating film of claim 19 is formed on at least an outer lead part.

21. A palladium plating film according to claim 1 which has less than 1% of cation central element of the quaternary compound observed by X-ray photoelectronic spectroscopy on the surface of the film after heat treatment and subjected to etching treatment.

22. A lead frame for semiconductor apparatuses wherein a palladium plating film of claim 21 is formed on at least an outer lead part.

23. A palladium plating film according to claim 1 wherein the cation component of the quaternary compound after heat treatment is converted to a carbonate compound according to time-of-flight type secondary ion-mass spectrography.

24. A lead frame for semiconductor apparatuses wherein a palladium plating film of claim 23 is formed on at least an outer lead part.

25. A lead frame for semiconductor apparatuses wherein a palladium plating film according to claim 1 is formed on at least an outer lead part.

* * * * *

UNITED STATES PATENT AND TRADEMARK OFFICE
CERTIFICATE OF CORRECTION

PATENT NO.    : 6,159,623
DATED         : December 12, 2000
INVENTOR(S)   : Hisahiro Tanaka It is certified that error appears in the above-identified patent and that said Letters Patent is hereby corrected as shown below:

<u>Column 5,</u>
Line 9, "50-10" should read -- 50-100 -- and
Line 21, "50-1000" should read -- 50-100 --.

Signed and Sealed this

Fourth Day of January, 2003

JAMES E. ROGAN
*Director of the United States Patent and Trademark Office*